United States Patent [19]

Augstein et al.

[11] 4,452,881
[45] Jun. 5, 1984

[54] METHOD OF ADJUSTING THE EDGE ANGLE IN POLYSILICON

[75] Inventors: Wolfgang Augstein, Holzgerlingen; Peter Frasch; Blanka Ivancic, both of Sindelfingen; Markus A. Zuegel, Kressbach, all of Fed. Rep. of Germany

[73] Assignee: International Business Machines Corporation, Armonk, N.Y.

[21] Appl. No.: 494,755

[22] Filed: May 16, 1983

[30] Foreign Application Priority Data

Jun. 14, 1982 [EP] European Pat. Off. ....... 82 105173.7

[51] Int. Cl.$^3$ .......................... G03C 5/00; B44C 1/22
[52] U.S. Cl. .................................... 430/323; 430/317; 430/327; 430/330; 156/628; 156/659.1; 156/662
[58] Field of Search ............... 430/313, 317, 323, 327, 430/330; 156/628, 657, 659.1, 662

[56] References Cited

U.S. PATENT DOCUMENTS

| | | | |
|---|---|---|---|
| 3,811,076 | 5/1974 | Smith, Jr. ......................... | 317/235 R |
| 3,827,908 | 8/1974 | Johnson et al. ..................... | 117/201 |
| 3,841,926 | 10/1974 | Garnache et al. .................. | 148/188 |
| 3,942,982 | 3/1976 | Yanazawa et al. ............. | 430/327 X |
| 4,004,044 | 1/1977 | Franco et al. .......................... | 427/43 |
| 4,160,991 | 7/1979 | Anantha et al. ...................... | 357/52 |

FOREIGN PATENT DOCUMENTS

| | | |
|---|---|---|
| 1550 | 5/1979 | European Pat. Off. . |
| 2363466 | 10/1980 | Fed. Rep. of Germany . |
| 2617914 | 5/1982 | Fed. Rep. of Germany . |

OTHER PUBLICATIONS

Goessler et al., IBM Technical Disclosure Bulletin, vol. 25, No. 12, May 1983, p. 6640.
Article by E. Terner entitled "Improved FET Performance" published in IBM Technical Disclosure Bulletin, vol. 13, No. 10, Mar. 1971.

Primary Examiner—John E. Kittle
Assistant Examiner—José G. Dees
Attorney, Agent, or Firm—George Tacticos

[57] ABSTRACT

The invention relates to a method of adjusting the edge angle of openings that are etched in a polysilicon layer.

The steepness of the edge angles can be adjusted by means of a treatment of the polysilicon layer prior to the making of the photoresist mask with a mixture of 5 parts water and 1 to 3 parts ammonia and 0.25 to 1 part hydrogen peroxide. This pre-treatment is advantageously carried out at a temperature between 40° and 70° C.

7 Claims, 5 Drawing Figures

METHOD OF ADJUSTING THE EDGE ANGLE IN POLYSILICON

DESCRIPTION

1. Technical Field

The invention relates to a method of adjusting the edge angle of openings in a polycrystalline silicon (hereinafter referred to as "polysilicon") layer where, on the polysilicon layer to be etched, a resist mask is produced using a photolithographic process, and the exposed polysilicon is subsequently etched.

2. Background

The method as disclosed herein is particularly useful in the production of integrated storage arrangements where several storage cells are arranged in a semiconductor substrate, each having a Field Effect Transistor (FET) serially connected to a capacitor. The physical structures of this storage arrangement are described in U.S. Pat. No. 3,811,076, issued on May 14, 1974, to W. M. Smith, Jr., and the process of making these structures is described in the commonly assigned U.S. Pat. No. 3,841,926, issued to R. R. Garnache et al. Among the characteristic features of this process, to which further reference will be made below in the specification, are the multi-layer gate insulation [silicon dioxide ("oxide")/silicon nitride ("nitride")], a field shield layer of p-doped polysilicon, and a diffusion source of doped oxide.

However, the use of the method as disclosed by the invention is not restricted to the production of the above-mentioned structures but can also be employed in other semiconductor processes.

It has been found that if the storage cells are made in accordance with the teachings of U.S. Pat. Nos. 3,811,076 and 3,841,926, the edge angles of the openings in the field shield layer of polysilicon have to be set, for reliability reasons, to less than 45°. These shallow edge angles cannot be made with conventional photolithographic methods in p-doped polysilicon layers; typically, steeper angles are obtained on the order of 60° to 70°.

It has already been suggested to add, to the positive photoresist which is used in a photolithographic process for making openings in polysilicon, 1-hydroxy-ethyl-2-alkyl imidazoline which is commercially available under the designation Monazoline produced by Mona Industries, Inc. The addition of such a compound was suggested for the purpose of influencing the degree of adhesion of the photoresist around the motives to be etched so that, after etching, shallow edge angles in the polysilicon are obtained. However, the degree of adhesion of the photoresist according to this process has proved difficult to control.

DISCLOSURE OF INVENTION

It is therefore an object of the invention to provide a method of setting the edge angle of openings in a polysilicon layer, wherein the photoresist adhesion in the photolithographic process is influenced by a suitable pre-treatment in such a manner that, in the subsequent etching of the exposed zones of the polysilicon layer, shallow edge angles can be obtained.

According to patent claim 1, this object of the invention can be accomplished by treating the polysilicon layer, prior to the application of the photoresist layer, with a mixture of 5 parts water, 1 to 3 parts ammonia, and 0.25 to 1 part hydrogen peroxide. A suitably selected temperature during processing can also influence the steepness of the edge angle.

With the method disclosed herein, it is possible to effectively prevent a phenomenon referred to as "sidewalk effect" which involves the formation of a parasitic channel between source and drain of an FET after positive gate stress, and is caused by mobile charged contaminants near the edge of the metal gate.

BRIEF DESCRIPTION OF DRAWINGS

The following specification details, with reference to FIGS. 1a through 1c, a method of making an integrated storage arrangement in accordance with the teachings of U.S. Pat. Nos. 3,811,076 and 3,841,926 into which the process as disclosed by the invention is incorporated.

DETAILED DESCRIPTION OF DRAWINGS

Figure 1A:
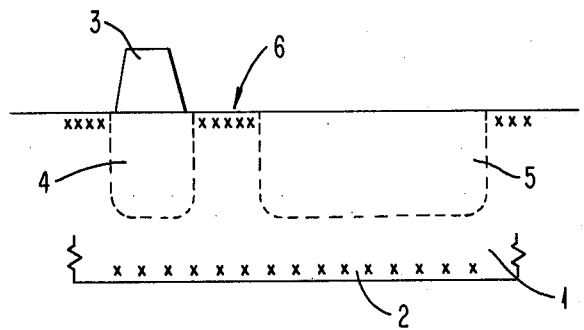
Figure 1B:
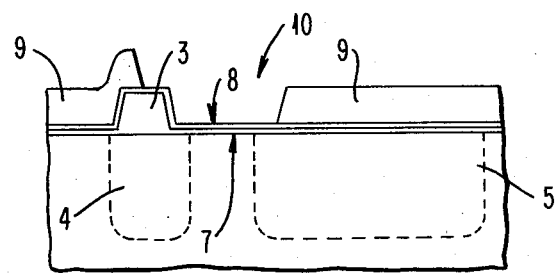
Figure 1C:
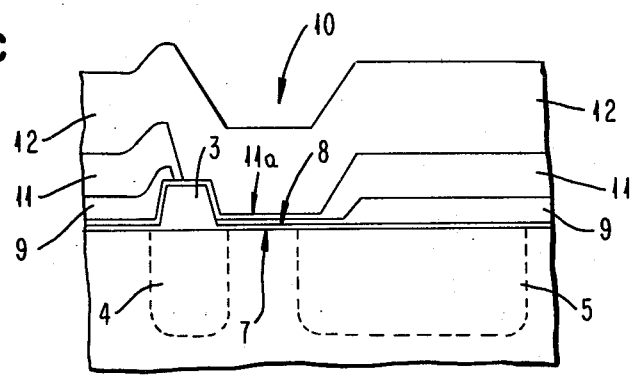

Referring first to FIGS. 1a–1c, the method for making integrated storage arrangements, such as the Silicon and Aluminum Metal Oxide Semiconductor ("SAMOS") devices, is described.

FIG. 1a shows a substrate 1 of p-doped silicon having on its back side an amorphous silicon layer 2 used for controlling leakage currents. This amorphous silicon layer is made through the implantation of argon with sufficient dosage and energy to cause the amorphization of the affected silicon layer.

The following three steps constitute the SAMOS diffusion process. First, an arsenic-doped oxide layer and an undoped oxide layer thereon are vapor deposited on the wafer in a reactor. The blanket-deposited doped oxide layer is structured in a photolithographic process using a first mask. In the subsequent drive-in step, As$_2$O$_3$ diffuses from the oxide zones 3 to the silicon substrate 1 and is reduced there as follows:

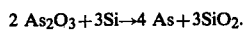

$$2\ As_2O_3 + 3Si \rightarrow 4\ As + 3SiO_2.$$

This reaction is implemented in an oxidizing atmosphere, thus preventing the formation of an arsenic layer. Thereafter, in an O$_2$/N$_2$-cycle, the proper amount of arsenic is introduced into the silicon in the desired zones of the bit line 4 (source), and the storage node 5 (drain). This is then followed by a drive-in step in pure nitrogen through which the arsenic is driven into the proper depth. During the arsenic diffusion in an O$_2$/N$_2$-atmosphere, a thin thermal oxide layer grows on the wafer surface which is used as a screen for the following boron implantation 6.

The implantation of boron which results in a doping profile of approximately $1.8 \times 10^{16}$ atoms/cm$^3$ on the wafer surface is used for setting a constant threshold voltage.

In a photolithographic process using a second mask subsequent to the ion implantation, the doped oxide 3 over the storage node 5 is removed, whereas it remains over the bit line 4. After removal of the photoresist, the thin drive-in oxide is also removed from the wafer surface. FIG. 1a depicts the storage cell at this state.

In the following series of processing steps, insulators and conductors for controlling the surface state of the wafer are formed. For that purpose, an oxide layer 7 is thermally grown on the wafer 1. This layer is used as a gate insulation of the FET. Subsequently, a nitride layer 8 is formed through a vapor deposition process. The thickness ratio of both layers is adapted to the characteristics of the integrated circuits to be made. A polysilicon layer 9 is deposited on the oxide/nitride insulation. This layer is doped to a high conductivity with an acceptor material, e.g., boron. It is at this point that the claimed method as disclosed herein is introduced into the process described in U.S. Pat. No. 3,841,926. From those areas which are provided as gate 10 and as contacts to the silicon (not shown), the polysilicon 9 is subsequently removed using a photolithographic process with a third mask. At this point the structure is as depicted in FIG. 1b.

To complete the integrated circuit, a second oxide layer 11 is generated by thermal oxidation on the polysilicon layer 9, in such a manner that the edges of layer 9 are also completely covered with oxide. During this oxidation, the polysilicon 9 is converted into an oxide layer with a thickness of approximately 300 nm. Simultaneously, it forms only a very thin oxide layer 11a on the nitride layer 8 exposed in the gate opening 10, since silicon dioxide grows very slowly on silicon nitride.

Using a fourth mask made in a photolithographic process, the oxide 11a on the gate electrode is etched simultaneously with the contact openings (not shown) to the polysilicon 9, the silicon substrate 1, and the diffused lines, by adjusting the temperature and the relative concentrations of buffered hydrofluoric acid and water in the etchant. Subsequently, an aluminum layer 12 is vapor deposited on the surface of the device. It is patterned using a fifth mask, in accordance with a metal lift-off method described in U.S. Pat. No. 4,004,044. FIG. 1c shows the resulting structure after the first metallization. Insulated parts of the aluminum layer 12 establish the electric connection between the polysilicon field shield 9 and the semiconductor substrate 1. The surface of the structure is coated with a sputtered quartz layer for protection and passivation purposes. The present specification does not go into detail about the application of a further metallization. This is done using known processing techniques.

Figure 2:
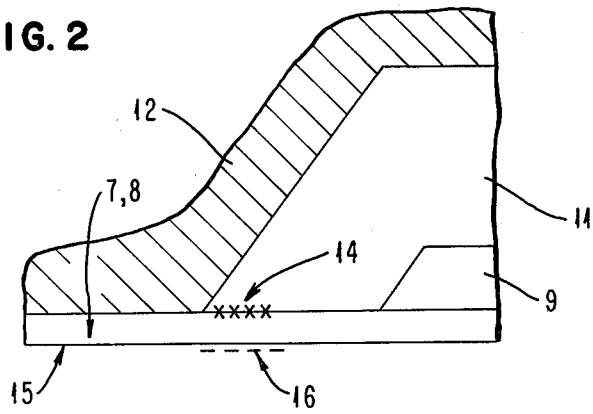
With reference to FIG. 2, the so-called sidewalk effect, which is one of the reliability problems of this method, is explained, followed by an embodiment of the invention.

The method as described in the preceding paragraphs presents some reliability problems. Some of these problems refer to the vertical movement of charges within the gate dielectric, or the vertical movement of charges into the gate dielectric. Another problem, which will be discussed here in detail with reference to FIG. 2 and whose elimination is the object of the present invention, concerns the formation of a parasitic channel 16 in an FET between source and drain regions after a positive gate stress. This sidewalk effect, referred to in the Background section, is caused by mobile charged contaminants 14 near the edge of the metal gate 12, and the existing recessed areas into which the contaminants can be driven. A repeated positive bias on the gate has the effect that the ions 14 reach the area between the metal gate 12 and the field shield 9. In this manner, what is depicted in FIG. 2 can be reached by the ions 14 that are not in contact with any of the two conductors 9 or 12. The result of this charge distribution is a parallel parasitic channel 16 which, unlike the conventional FET channel 15, is not controlled by the metal gate 12. The elimination of these ions has proved difficult.

In order to avoid the accumulation of conductive contaminants, it has proved advantageous to etch the polysilicon layer 9 over the gate in such a manner that shallow polysilicon edge angles are obtained. If these edge angles are sufficiently shallow, no sharp end of the polysilicon oxide edge 11 will be formed in the subsequent oxidation.

It has been found that etching angles greater than 35° into the polysilicon is undesirable. In that case, a vertical overhanging polysilicon edge will form during reoxidation. This overhang will fix or enclose contaminants on the gate surface which in the subsequent aluminum lift-off process can no longer be removed and, as specified above, will cause reliability problems. If, on the other hand, the polysilicon is etched in such a manner that edge angles less than 15° are made, all the polysilicon of which the conductive line consists will be oxidized during the subsequent reoxidation resulting in a considerable reduction in the yield.

According to the invention, suitable pre-treatment of the polysilicon will ensure that, in the subsequent photolithographic process, adhesion of the resist to the polysilicon layer 9 in the vicinity of the gate 10 to be etched and the contacts to be etched is modified in such a manner that during the etching through the photoresist mask, subsequent to exposure, development and curing of the photoresist, etching angles between 15° and 35° are obtained. Usually, steeper etching angles are obtained due to the doping profile of the polysilicon when the process is performed in accordance with conventional photolithographic methods.

Surprisingly, pre-treatment solutions containing ammonia, hydrogen peroxide, and water which are used in semiconductor technology to remove organic contaminants from wafer surfaces have turned out to be particularly suitable for influencing the photoresist adhesion, if the individual components are contained in the solution in a specific ratio of concentration. Another factor influencing the steepness of the edge angle can be the selection of a specific range of temperature. Experiments have revealed that the etching angles become steeper as the amount of ammonia in the solutions increases, and that they become shallower as the hydrogen peroxide content in the solution increases. Particularly suitable are solutions containing 5 parts water, 1 to 3 parts ammonia and 0.25 to 1 part hydrogen peroxide. To prepare the solutions, concentrated aqueous solutions of ammonia (28 to 29%) and hydrogen peroxide (30%) are used. The pre-treatment solutions can be used as long as active hydrogen peroxide is available in the above-described range of concentration. For practical reasons, a pre-treatment of 4 hours has proved satisfactory.

It is advantageous if, apart from the above-mentioned concentrations of ammonia and hydrogen peroxide, predetermined temperatures are maintained during the substrate pre-treatment. When bath temperatures are less than 40° C. the edge angle becomes too shallow, i.e., less than 13°, and when bath temperatures are more than 70° C. it becomes too steep. It is therefore an advantage to pre-treat the substrates that are covered with the polysilicon layer with solutions containing ammonia and hydrogen peroxide in the above-mentioned concentration, and to carry out such pre-treatment with bath temperatures between 40° and 70° C. The period of pre-treatment is not a critical factor.

Best Mode for Carrying Out the Invention

Substrates 1 with a polysilicon layer 9 are processed with an aqueous ammonia hydrogen peroxide solution, containing 5 parts water, 1 to 3 parts ammonia, and 0.25 to 1 part hydrogen peroxide. As specified above, the bath temperature is preferably between 40° and 70° C. The pre-treatment is performed for two hours.

Subsequently, the thus pre-treated wafers are coated with an adhesion promoter, e.g., hexamethyl disilazane. Then, a positive photoresist dissolved in a mixture of organic solvents is applied, e.g., a resist supplied by Shipley Company, Inc. under the trade name AZ 1350J which consists of an m-cresol-formaldehyde novolak resin and a diazoketone sensitizer identified as a 4'-2'-3'-dihydroxybenzophenone ester of the 1-oxo-2-diazonaphthalene sulphonic acid. Subsequently, the photoresist layer is dried for 3 to 15 minutes at 80° to 100° C., and exposed in a known manner. The period of exposure depends on the motive size of the respective structures, and on the exposure device used.

The exposed photoresist layer is developed in a known manner in a developer on the basis of sodium hydrogen phosphate, sodium metasilicate, and sodium hydroxide, and cured for approximately 15 minutes at 130° C. After the curing of the resist mask, the polysilicon layer 9 is etched in an $HNO_3$-HF-$H_2O$ mixture.

Figure 3:
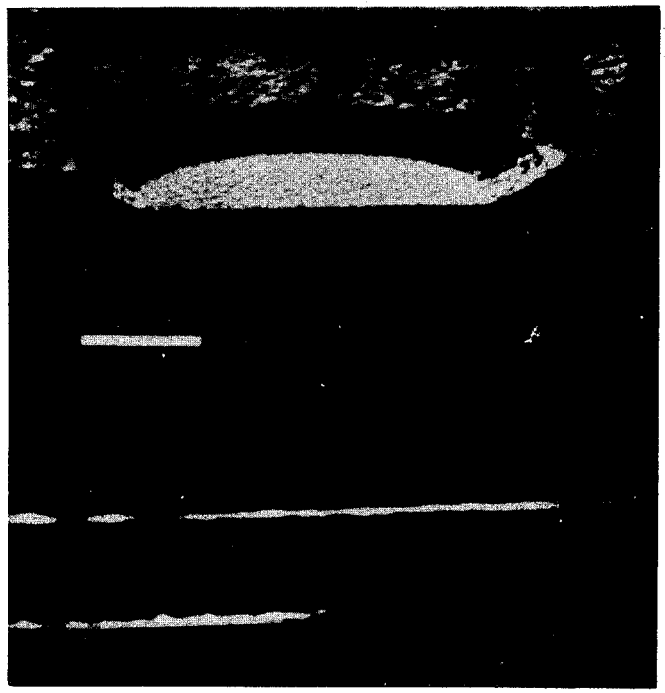
FIG. 3 depicts a scanning electron microscope photograph of the etching edge of an opening in the polysilicon layer.

The edge angle of the openings in the polysilicon layer is measured with the scanning electron microscope (SEM) with the sample at a 90° angle. FIG. 3 depicts such a photography:

pre-treatment: $H_2O$: $NH_3$: $H_2O_2$ = 5:1:1 edge angle: 24°

As specified above, the method according to the invention for adjusting the edge angle can be used to effectively prevent the sidewalk effect which is caused by the formation of a parasitic channel between source and drain of an FET upon the positive stress of the gate through mobile charged contaminants near the edge of the metal gate. This results in an improved product yield of the SAMOS-process.

What is claimed is:

1. A method of forming openings in a polysilicon layer which is disposed on a silicon substrate wherein said openings have edge angles that can be adjusted to a preselected level including applying a photoresist layer on said polysilicon layer, forming through photolithographic processes a photoresist mask on said polysilicon layer and etching the exposed portions of said polysilicon layer, characterized by treating said polysilicon layer with a mixture of 5 parts water, 1 to 3 parts ammonia and 0.25 to 1 part hydrogen peroxide prior to applying said photoresist layer on said polysilicon layer.

2. A method as set forth in claim 1 which is further characterized in that said processing step of treating said polysilicon layer with said mixture of water, ammonia and hydrogen peroxide is effected at a temperature of 40° to 70° C.

3. A method as set forth in claim 1 which is further characterized in that said polysilicon layer is a boron doped polysilicon layer.

4. A method as set forth in claim 3, which is further characterized in that said polysilicon layer has the same conductivity as said substrate material.

5. A method as set forth in claim 1 which is further characterized by the formation of a silicon dioxide layer on said polysilicon layer following the etching of said openings in said polysilicon layer.

6. A method of forming openings in a polysilicon layer wherein said openings have edge angles that can be adjusted to a preselected angle level, comprising:
   treating said polysilicon layer with a mixture of 5 parts water, 1 to 3 parts ammonia, and 0.25 to 1 part hydrogen peroxide;
   applying a layer of a positive photoresist material on said polysilicon layer;
   forming through image exposure, development and curing of said photoresist the desired photoresist mask on said polysilicon layer; and
   etching through said mask said polysilicon layer using an $HNO_3$-HF-$H_2O$ mixture.

7. A method as set forth in claim 1 or claim 5 wherein the relative proportion of each material in said mixture of water, ammonia and hydrogen peroxide is adjusted within the limit of said claims to produce etching angles of 15° to 35°.

* * * * *